United States Patent [19]
Nakagawa

[11] Patent Number: 5,831,458
[45] Date of Patent: Nov. 3, 1998

[54] OUTPUT CIRCUIT HAVING BINMOS INVERTERS

[75] Inventor: Atsushi Nakagawa, Tokyo, Japan

[73] Assignee: NEC Corporation, Tokyo, Japan

[21] Appl. No.: 788,643

[22] Filed: Jan. 27, 1997

[30] Foreign Application Priority Data

Jan. 26, 1996 [JP] Japan .................................. 8-033070

[51] Int. Cl.⁶ .................................................. H03B 1/00
[52] U.S. Cl. ............................ 327/108; 327/112; 327/433; 326/57
[58] Field of Search ................................ 326/56, 57, 58, 326/64, 84; 327/108, 109, 110, 111, 112, 433

[56] References Cited

U.S. PATENT DOCUMENTS 5,105,103 4/1992 Neu ........................................... 326/56

FOREIGN PATENT DOCUMENTS 4-186918 7/1992 Japan .

*Primary Examiner*—Toan Tran
*Assistant Examiner*—Jeffrey Zweizig

*Attorney, Agent, or Firm*—Young & Thompson

[57] ABSTRACT

An output circuit of the present invention comprises a logic gate having a data signal and a control signal as input signals, a first P channel transistor having a gate connected to an output terminal of the logic gate and a source•drain path connected between a first power source terminal and a node, a first N channel transistor having a gate connected to the output terminal of the logic gate and a source•drain path connected between a second power source terminal and the node, a bipolar transistor having a base connected to the node, a collector connected to the first power source terminal and an emitter connected to an output terminal of the output circuit, a second P channel transistor having a gate connected to the output terminal of the logic gate and a source•drain path connected between the first power source terminal and the output terminal of the output circuit, a second N channel transistor having a gate connected to the output terminal of the logic gate and a source•drain path connected between the second power source terminal and the output terminal of the output circuit, a third N channel transistor having a gate supplied with the control signal and a source•drain path connected between the second power source terminal and the node and a fourth N channel transistor having a gate supplied with the control signal and a source•drain path connected between the second power source terminal and the output terminal of the output circuit.

4 Claims, 4 Drawing Sheets

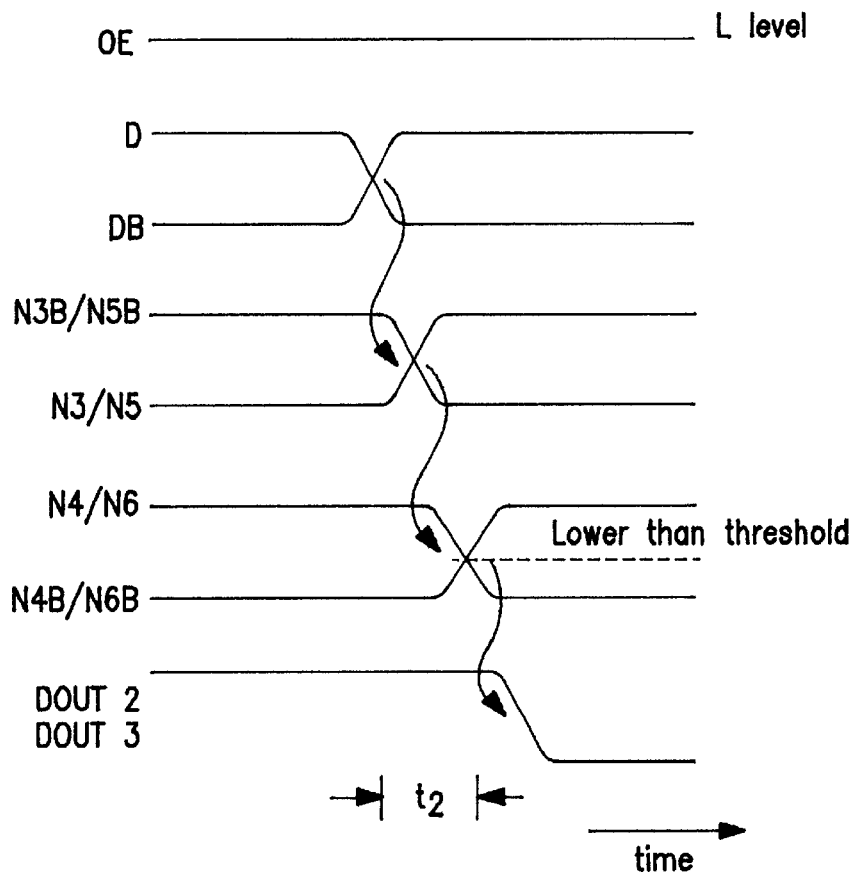
FIG. 2A PRIOR ART
FIG. 2B PRIOR ART
FIG. 2C PRIOR ART
FIG. 2D PRIOR ART
FIG. 2E PRIOR ART
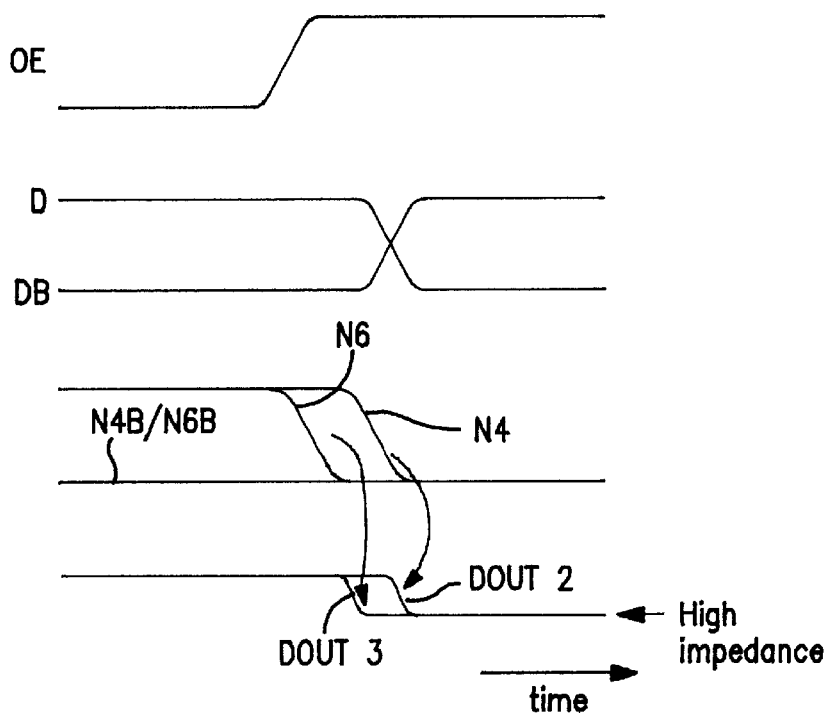
FIG. 3A PRIOR ART
FIG. 3B PRIOR ART
FIG. 3C PRIOR ART
FIG. 3D PRIOR ART

DOUT 3
DOUT 1
High impedance
$t_1$
time

OUTPUT CIRCUIT HAVING BINMOS INVERTERS

BACKGROUND OF THE INVENTION

1. Field of the Invention

The present invention relates to an output circuit and, particularly, to an output circuit having BiNMOS inverters.

2. Description of the Prior Art

In general, an output circuit is constructed with output transistors and buffer circuits for driving these transistors. In case of an output circuit used in a memory circuit, the output circuit is supplied with a data signal read out from a memory cell and an output enable signal for switching a state of an output between "low impedance state" and "high impedance state".

FIG. 1 shows an example of a construction of a prior art output circuit. Signals D and DB are complementary data signals read out from memory cells which are not shown and supplied to one input terminals of 2-input NAND circuits 24 and 32, respectively. OE denotes the output enable signal which is supplied to inverters 23 and 31. Output terminals of the inverters 23 and 31 are connected to the other input terminals of the NAND circuit 24 and 32, respectively, and output terminals of the NAND circuits 24 and 32 are connected to input terminals of circuit blocks 30 and 38, respectively.

As shown in FIG. 1, the circuit blocks 30 and 38 are identical and, therefore, only the circuit block 30 will be described.

In the circuit block 30, gates of P channel MOS transistors (referred to as "PMOS transistors", hereinafter) 25 and 29 and N channel MOS transistors (referred to as "NMOS transistors", hereinafter) 26 and 28 are commonly connected to an input terminal of the circuit block 30. The PMOS transistor 25 has a source connected to a high potential side power source terminal VDD and a drain connected to a base of an NPN bipolar transistor (referred to as "bipolar transistor", hereinafter) 27 and a drain of the NMOS transistor 26. A source of the NMOS transistor 26 is connected to a low potential side power source terminal VSS. Further, the bipolar transistor 27 has a collector connected to the high potential side power source terminal VDD, an emitter connected to the drain of the NMOS transistor 28 having the source connected to the low potential side power source VSS and a source connected to a junction between the drain of the PMOS transistor 29 having the source connected to the high potential side power source VDD and the drain of the PMOS transistor 29 having the source connected to the high potential side power source VDD. The junction constitutes an output terminal of the circuit block 30.

The circuit blocks 30 and 38 are constructed with the so-called "BiNMOS inverters" having the pull-up PMOS transistors 29 and 37 provided at the output terminals thereof, respectively.

The output terminal of the circuit block 30 is connected to a gate of an NMOS transistor 38 and the output terminal of the circuit block 38 is connected to a gate of an NMOS transistor 39. The NMOS transistors 38 and 39 are output transistors and a drain and a source of the NMOS transistor 38 are connected to an output power source VDDQ and a drain of the NMOS transistor 39, respectively. A source of the NMOS transistor 39 is connected to the low potential side power source VSS.

An operation of the prior art output circuit shown in FIG. 1 will be described with reference to timing charts shown in FIGS. 2 and 3. FIG. 2 shows signal waveforms of data in the output state being fixed to low impedance state and FIG. 3 shows signal waveforms when the output state is changed from low impedance state to high impedance state.

The case of data variation will be described by referring first to FIG. 2, with an assumption that the output enable signal OE is always in "L" level (low level) (see FIG. 2(a)). In this state, the one input terminals of the NAND circuits 24 and 32 which are supplied with the output enable signal OE through the inverters 23 and 31 are continuously in "H" level. Therefore, the NAND circuits 24 and 32 become always active state and operate to output inverted values of logical values at the other input terminals thereof as inverters, respectively. Thus, nodes N3 and N3B which are outputs of the NAND circuits 24 and 32, that is, the input terminals of the circuit blocks 30 and 38, become "L" and "H" levels, respectively, when the signals D and DB are in respective "H" and "L" levels.

Assuming that, with initial states of the signals D and DB being respective "H" and "L" levels, the signals D and DB are changed at a certain time instance from "H" and "L" levels to "L" and "H" levels, respectively, as shown in FIG. 2(b), the nodes N3 and N3B are changed from "L" and "H" levels to "H" and "L" levels, respectively, with a delay time (propagation delay time) of the NAND circuits 24 and 32 (see FIG. 2(c)).

The circuit blocks 30 and 38 operate upon the changes of potential at the nodes N3 and N3B. By the potential change of the node N3 from "L" to "H" in the circuit block 30, the bipolar transistor 27 and the PMOS transistor 29 are turned off and the NMOS transistor 28 is turned on. Therefore, the potential at a node N4 which is the output terminal of the circuit block 30 is pulled down from "H" to "L". Further, in the circuit block 38, the node N3B is pulled down from "H" to "L", so that the NMOS transistor 36 is turned off and the bipolar transistor 35 and the PMOS transistor 37 are turned on, causing the node N4B which is the output terminal of the circuit block 38 being pulled up from "L" to "H".

As described, the output terminals N4 and N4B of the circuit blocks 30 and 38 are changed from "L" and "H" levels to "H" and "L" levels, respectively (see FIG. 2(d)). In this case, the circuit is designed such that a level of crossing of signals at the nodes N4 and N4B becomes lower than a threshold voltage $V_{TN}$ of the NMOS transistors 38 and 39, as shown in FIG. 2(d). With such design, the output NMOS transistors 38 and 39 are prevented from being turned on simultaneously to thereby prevent a current from flowing from the output power source terminal VDDQ to the low potential side power source terminal VSS.

With the change of the nodes N4 and N4B from "L" and "H" to "H" and "L", respectively, the NMOS transistor 38 is turned on and the NMOS transistor 39 is turned off. Therefore, an output signal BOUT2 of the output circuit is changed from "H" to "L" (see FIG. 2(e)). The case where data changes when the output is in low impedance state has been described.

It has been known that, as the NMOS transistors 38 and 39, transistors having large gate width (W) are usually used and so gate capacitances thereof become large. Therefore, it is possible to pull up the gate potentials of the NMOS transistors 38 and 39 instantaneously by using the bipolar transistors 27 and 35 which have superior driving performance to drive the NMOS transistors.

When the bipolar transistors are used therefor, however, the gate levels of the NMOS transistors 38 and 39 are increased by only a value (VDD−Vf) where Vf is a forward bias voltage of the bipolar transistor, resulting in degradation in performance of the output transistors. In order to increase the gate up to the high potential side power source potential VDD, the PMOS transistors 29 and 37 are connected between the high potential side power source VDD and the NMOS transistors 38 and 39, respectively.

Referring to the timing chart shown in FIG. 3, it is assumed that, in the initial state, the output enable signal OE is in "L" level and the signals D and DB are in "H" and "L", respectively. Since, when the output enable signal OE is in "L" level, the NAND circuits 24 and 32 act to invert the signals D and DB as mentioned previously, the nodes N3 and N3B are kept in "L" and "H" levels, respectively.

By the inverting operation of the circuit blocks 30 and 38, the nodes N4 and N4B which are the output terminals of the circuit blocks 30 and 38 are kept at "H" and "L", respectively, so that the output NMOS transistors 38 and 39 are turned on and off, respectively, and the output signal DOUT2 is maintained at the output power source potential VDDQ.

When the output enable signal OE is changed from "L" to "H" in this state, both the NAND circuits 24 and 32 become inactive and the nodes N3 and N3B are changed from "L" and "H" levels to "H" and "H" level, respectively. Therefore, the output nodes N4 and N4B of the circuit blocks 30 and 38 are changed from "H" and "L" to "L" and "L", respectively, (see FIG. 3(c)) and the NMOS transistors 38 and 39 are turned off, resulting in the high impedance state (see FIG. 3(d)).

As described, in the prior art output circuit, the capacitive load of the last gate which is driven by the output enable signal becomes heavy with increase of the number of output pins of a device and the time required for the change from low impedance state to high impedance state becomes long.

BRIEF SUMMARY OF THE INVENTION

Objects of the Invention

An object of the present invention is, therefore, to provide an output circuit in which a gate capacitance to be driven by an output enable signal is reduced such that a time required for a state change from low impedance state to high impedance state can be shortened.

Summary of the Invention

An output circuit of the present invention comprises a logic gate having a data signal and a control signal as input signals, a first P channel transistor having a gate connected to an output terminal of the logic gate and a source•drain path connected between a first power source terminal and a node, a first N channel transistor having a gate connected to the output terminal of the logic gate and a source•drain path connected between a second power source terminal and the node, a bipolar transistor having a base connected to the node, a collector connected to the first power source terminal and an emitter connected to an output terminal of the output circuit, a second P channel transistor having a gate connected to the output terminal of the logic gate and a source•drain path connected between the first power source terminal and the output terminal of the output circuit, a second N channel transistor having a gate connected to the output terminal of the logic gate and a source•drain path connected between the second power source terminal and the output terminal of the output circuit, a third N channel transistor having a gate supplied with the control signal and a source•drain path connected between the second power source terminal and the node and a fourth N channel transistor having a gate supplied with the control signal and a source•drain path connected between the second power source terminal and the output terminal of the output circuit.

BRIEF DESCRIPTION OF THE DRAWINGS

The above mentioned and other objects, features and advantages of the present invention will become more apparent by reference to the following detailed description of the invention taken in conjunction with the accompanying drawings, wherein:

FIGS. 2 and 3 show operating waveforms of the circuit shown in FIG. 1;

DETAILED DESCRIPTION OF THE INVENTION

Figure 1:
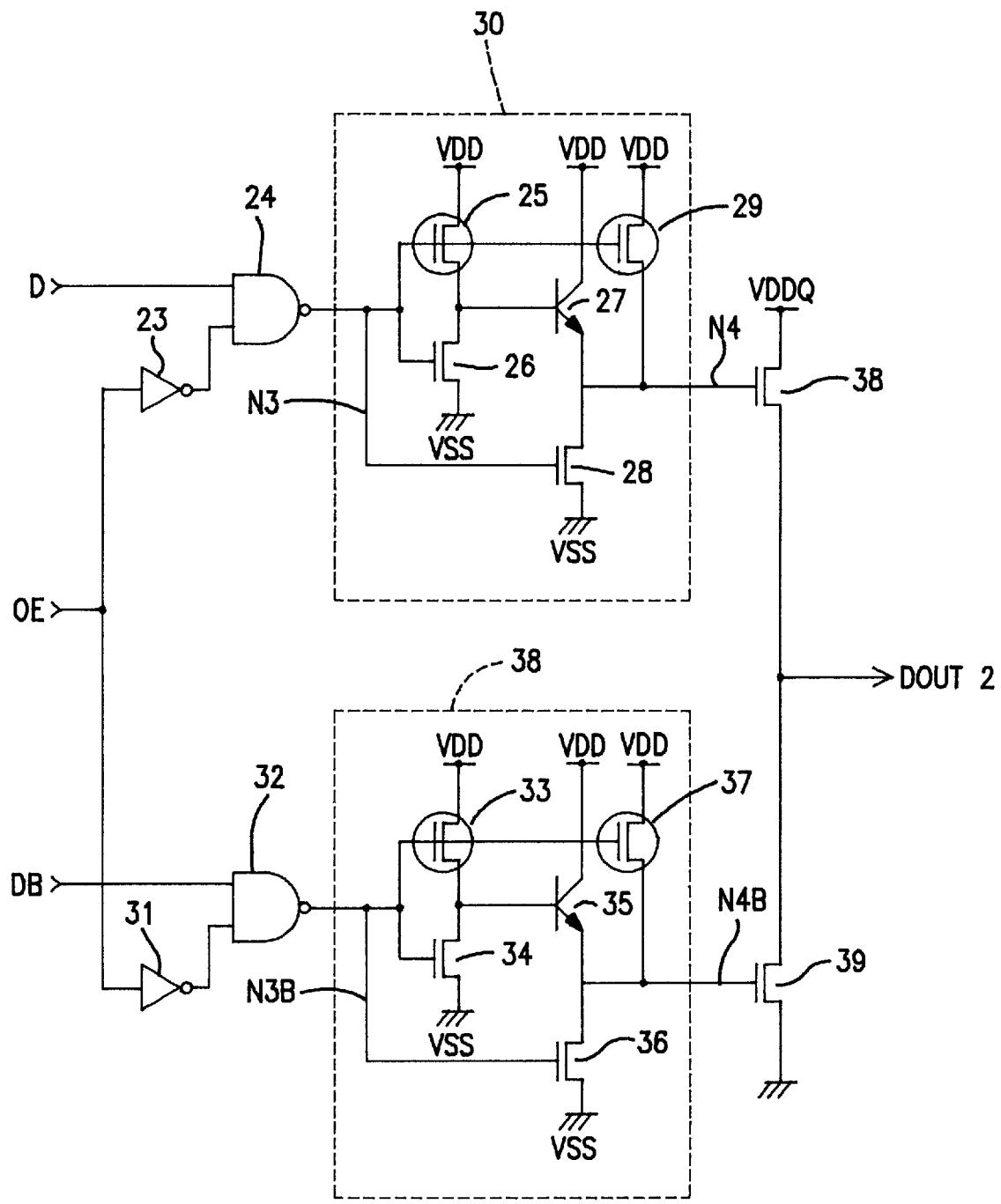
FIG. 1 shows a circuit diagram of a prior art output circuit.
Figure 4:
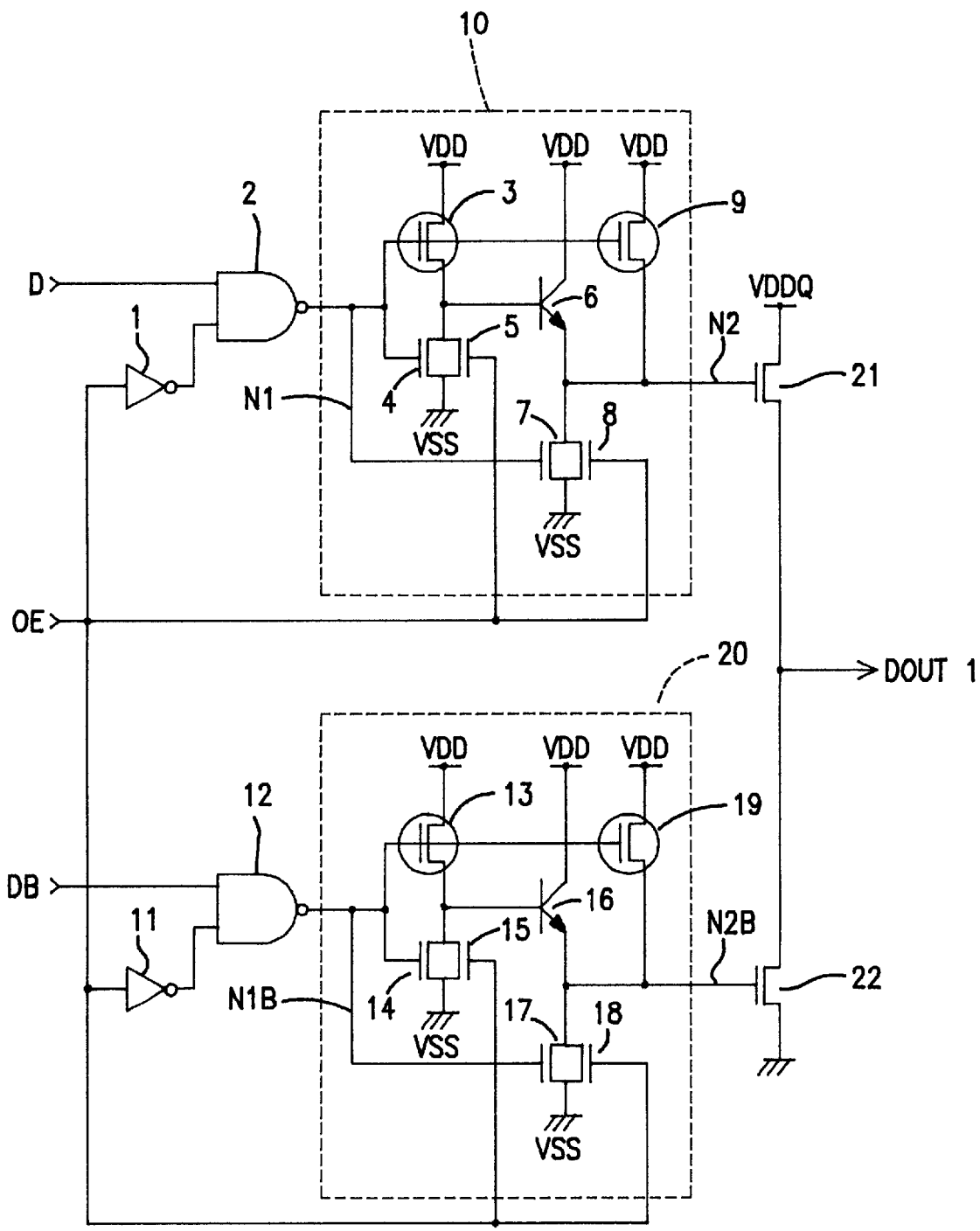
FIG. 4 is a circuit diagram of an output circuit according to the present invention.

FIG. 4 shows a circuit construction of an output circuit according to an embodiment of the present invention. Signals D and DB are complementary data signals read out from memory cells which are not shown and are input to one input terminals of 2-input NAND circuits 2 and 12, respectively. An output enable signal OE is input to inverters 1 and 11 and to gates of NMOS transistors 5, 8, 15 and 18 of circuit blocks 10 and 20. Since the circuit blocks 10 and 20 are identical, only the circuit block 10 will be described.

In the circuit block 10, gates of PMOS transistors 3 and 9 and NMOS transistors 4 and 7 are commonly connected to an output terminal of the NAND circuit 2. A source of the PMOS transistor 3 is connected to a high potential side power source terminal VDD and a drain thereof is connected to a junction between commonly connected drains of the NMOS transistors 4 and 5 and a base of a bipolar transistor 6. Sources of the NMOS transistors 4 and 5 are commonly connected to a low potential side power source terminal VSS.

The bipolar transistor 6 has a collector connected to the high potential side power source terminal VDD and an emitter connected to a junction between commonly connected drains of the NMOS transistors 7 and 8 and a drain of the PMOS transistor 9. A source of the PMOS transistor 9 is connected to the high potential side power source terminal VDD and an emitter of the bipolar transistor 6 constitutes an output terminal of the circuit block 10.

The output terminal of the circuit block 10 is connected to a gate of an NMOS transistor 21 and an output terminal of the circuit block 20 having an identical construction to that of the circuit block 10 is connected to a gate of an NMOS transistor 22. The NMOS transistors 21 and 22 are output transistors and the NMOS transistor 21 has a drain connected to an output power source terminal VDDQ and a source connected to a drain of the NMOS transistor 22 whose source is connected to the low potential side power source terminal VSS.

An operation of the output circuit of this embodiment will be described in detail with reference to a timing chart shown in FIG. 5. It is assumed that, while the output enable signal OE is in "L" level, initial states of the signals D and DB are in "L" and "H" levels, respectively, and the signals D and DB are changed at a time when an output signal OUT1 is in "L" level to "H" and "L" levels, respectively.

In a period in which the output enable signal OE is in "L" level, signals "H" obtained by inverting the output enable signal OE by the inverters 1 and 11 are supplied to one input terminals of the NAND circuits 2 and 12. Therefore, the NAND circuits 2 and 12 become active and operate as inverters for inverting the input signals D and DB, respectively. Accordingly, when the signals D and DB change from "L" and "H" to "H" and "L", respectively, (see FIG. 5(b)), the output terminals of the NAND circuits 2 and 12 as well as equipotential nodes N1 and N1B are changed from "H" and "L" to "L" and "H", respectively (see FIG. 5(c)).

Further, since, in the circuit blocks 10 and 20, the output enable signal OE is in "L" level and thus the NMOS transistors 5, 8, 15 and 18 are in off state, the circuit blocks 10 and 20 operate as inverters. For example, when the node N1 is "L" level, the PMOS transistor 3 is turned on, the NMOS transistors 4 and 7 are turned off and the emitter terminal of the bipolar transistor is pulled up causing the output terminal thereof to be "H" level. On the other hand, when the node N1 is "H" level, the PMOS transistor 3 is turned off and the NMOS transistors 4 and 7 are turned on causing the output terminal of the NMOS transistor 7 to be "L" level.

Figure 5E:
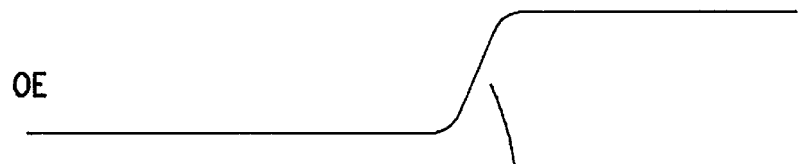
FIG. 5 shows operating waveforms of the circuit shown in FIG. 4.
Figure 5E:
Figure 5E:
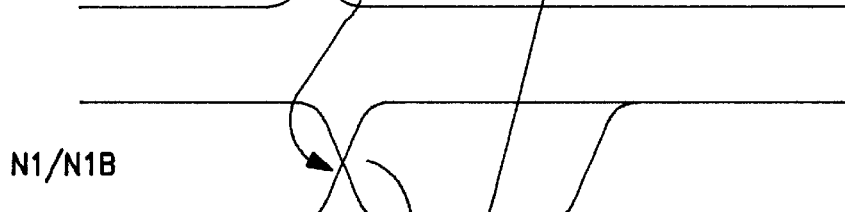
Figure 5E:
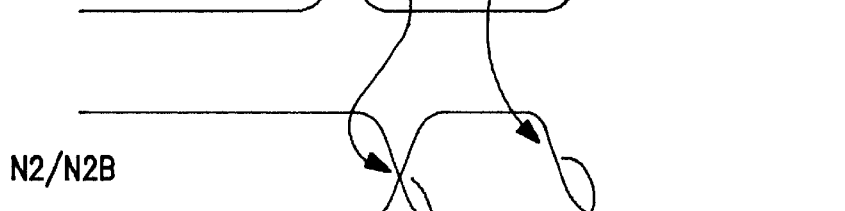
Figure 5E:
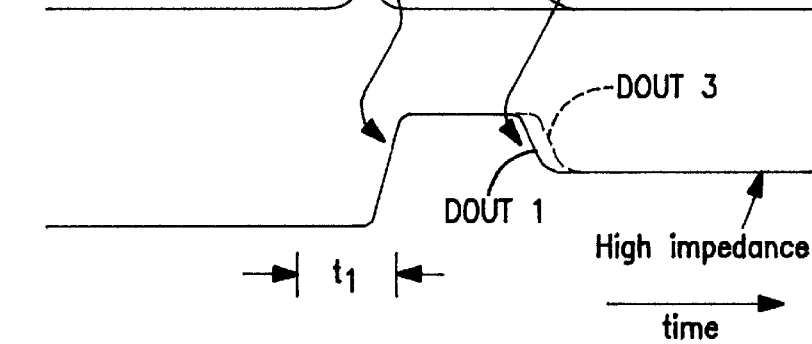

Therefore, the nodes N2 and N2B which are the output terminals of the circuit blocks 10 and 20 are changed from "H" and "L" to "L" and "H", respectively (see FIG. 5(d)). Since the NMOS transistors 21 and 22 are turned on and off, respectively, the output signal DOUT1 is changed from "L" to "H".

In this case, a delay time t1 from the changing time point of the input signals D and DB to the output signal DOUT1 is equal to t2 (see FIG. 2) and , therefore, there is no delay compared with the prior art output circuit.

Now, an operation of the output circuit when the output enable signal OE is changed from "L" to "H" will be described.

Due to the change of the signals D and DB, the states thereof are changed to "H" and "L", respectively and the output signal DOUT1 is kept at the output power source terminal VDDQ. Since the output enable signal OE is changed from "L" to "H" from this state, the NMOS transistors 8 and 18 are turned on and the gate potentials of the NMOS transistors 21 and 22 are pulled down to "L" level. Since the NMOS transistors 21 and 22 are thus turned off, the output signal DOUT1 becomes high impedance state.

Assuming that fan-out (proportional to a current drive performance of an output transistor) of the NAND circuit 2 is 4, fan-out of the inverter 1 is also 4, gate widths of the PMOS transistor and the NMOS transistor which constitute the inverter (CMOS inverter) 1 are Wp1 and Wn1 and a gate width of the PMOS transistor 3 is Wp2, the following equation is established:

$$Wp2 = 4 \times 4 \times Wp1$$

Further, assuming that PMOS transistor/NMOS transistor ratio of the inverter 1 is Wp1:Wn1=2:1 and gate length L of the PMOS transistor is equal to gate length of the NMOS transistor, gate capacitance of the inverter 1 is proportional to (½)Wp1+Wp1=(3/2)Wp1 since the gate capacitance is proportional to the gate width. The gate capacitance ratio of the PMOS transistor can be represented by the following equation:

Gate Capacitance of Inverter 1:Gate Capacitance of
PMOS transistor 3
= 3/2 × Wp1:16 × Wp1
= 3:32

From this, it is clear that the gate capacitance of the PMOS transistor 3 is about 10 times that of the inverter 1.

Particularly, when the number of the output circuits of the device increases, a total sum of gate capacitance for driving the output enable signal OE increases, so that the effect of this embodiment becomes remarkable.

Although the present invention has been described with reference to specific embodiments, this description is not meant to be construed in a limiting sense. Various modifications of the disclosed embodiments will become apparent to persons skilled in the art upon reference to the description of the present invention. It is, therefore, contemplated that the appended claims will cover any modifications or embodiments as fall within the true scope of the present invention.

What is claimed is:

1. An output circuit comprising:
    a logic gate having a data signal and a control signal as input signals;
    a first P channel transistor having a gate connected to an output terminal of said logic gate and a source•drain path connected between a first power source terminal and a node;
    a first N channel transistor having a gate connected to said output terminal of said logic gate and a source•drain path connected between a second power source terminal and said node;
    a bipolar transistor having a base connected to said node, a collector connected to said first power source terminal and an emitter connected to an output terminal of said output circuit;
    a second P channel transistor having a gate connected to said output terminal of said logic gate and a source•drain path connected between said first power source terminal and said output terminal of said output circuit;
    a second N channel transistor having a gate connected to said output terminal of said logic gate and a source•drain path connected between said second power source terminal and said output terminal of said output circuit;
    a third N channel transistor having a gate supplied with the control signal and a source•drain path connected between said second power source terminal and said node; and
    a fourth N channel transistor having a gate supplied with the control signal and a source•drain path connected between said second power source terminal and said output terminal of said output circuit.

2. An output circuit as claimed in claim 1, wherein said logic gate comprises an inverter circuit input with the control signal and a NAND gate input with an output of said inverter circuit and the data signal.

3. An output circuit comprising:
    a first logic gate having a data signal and a control signal as input signals;
    a first P channel transistor having a gate connected to an output terminal of said first logic gate and a source•drain path connected between a first power source terminal and a first node;
    a first N channel transistor having a gate connected to said output terminal of said first logic gate and a source•drain path connected between a second power source terminal and said first node;
    a bipolar transistor having a base connected to said first node, a collector connected to said first power source terminal and an emitter connected to a second node;

a second P channel transistor having a gate connected to said output terminal of said first logic gate and a source•drain path connected between said first power source terminal and said second node;

a second N channel transistor having a gate connected to said output terminal of said first logic gate and a source•drain path connected between said second power source terminal and said second node;

a third N channel transistor having a gate supplied with the control signal and a source•drain path connected between said second power source terminal and said first node;

a fourth N channel transistor having a gate supplied with the control signal and a source•drain path connected between said second power source terminal and said second node;

a fifth N channel transistor having a gate connected to said second node and a source•drain path connected between said first power source terminal and an output terminal of said output circuit;

a second logic gate having an inverted signal of a data signal and a control signal as input signals;

a third P channel transistor having a gate connected to an output terminal of said second logic gate and a source•drain path connected between said first power source terminal and a third node;

a sixth N channel transistor having a gate connected to said output terminal of said third logic gate and a source•drain path connected between said second power source terminal and said third node;

a bipolar transistor having a base connected to said third node, a collector connected to said first power source terminal and an emitter connected to a fourth node;

a fourth P channel transistor having a gate connected to said output terminal of said second logic gate and a source•drain path connected between said first power source terminal and said third node;

a seventh N channel transistor having a gate connected to said output terminal of said second logic gate and a source•drain path connected between said second power source terminal and said fourth node;

an eighth N channel transistor having a gate supplied with the control signal and a source•drain path connected between said second power source terminal and said third node;

a ninth N channel transistor having a gate supplied with the control signal and a source•drain path connected between said second power source terminal and said fourth node; and a tenth N channel transistor having a gate connected to said fourth node and a source•drain path connected between said second power source terminal and an output terminal of said output circuit.

4. An output circuit as claimed in claim 3, wherein said first logic gate comprises an inverter circuit having an input supplied with the control signal and a NAND gate having inputs supplied with an output of said inverter circuit and the data signal and said second logic gate comprises an inverter circuit having an input supplied with the control signal and a NAND gate having inputs supplied with an output of said inverter circuit and the inverted signal of the data signal.

* * * * *